(12) United States Patent
Matheson et al.

(10) Patent No.: US 10,061,363 B2
(45) Date of Patent: Aug. 28, 2018

(54) COMBINATION PARALLEL PATH HEATSINK AND EMI SHIELD

(71) Applicant: Apple Inc., Cupertino, CA (US)

(72) Inventors: Jonathan A. Matheson, San Jose, CA (US); Vinh H. Diep, Palo Alto, CA (US); Brian L. Chuang, Menlo Park, CA (US); Judith C. Segura, San Francisco, CA (US); Frank F. Liang, San Jose, CA (US); Leanne Bach Lien T. Ly, San Jose, CA (US); Kevin Z. Lo, Belmont, CA (US); Po W. Chiu, Campbell, CA (US); Lukose Ninan, Foster City, CA (US); Chong Li, Fremont, CA (US)

(73) Assignee: Apple Inc., Cupertino, CA (US)

( * ) Notice: Subject to any disclaimer, the term of this patent is extended or adjusted under 35 U.S.C. 154(b) by 89 days.

(21) Appl. No.: 14/846,526

(22) Filed: Sep. 4, 2015

(65) Prior Publication Data
US 2017/0071074 A1 Mar. 9, 2017

(51) Int. Cl.
*G06F 1/20* (2006.01)
*H05K 7/20* (2006.01)
(Continued)

(52) U.S. Cl.
CPC ............. *G06F 1/20* (2013.01); *H05K 1/0209* (2013.01); *H05K 7/20436* (2013.01);
(Continued)

(58) Field of Classification Search
CPC .............. H05K 7/205; H05K 7/20254; H05K 7/202545; H05K 7/20436; H05K 7/20472;
(Continued)

(56) References Cited

U.S. PATENT DOCUMENTS 6,317,325 B1 * 11/2001 Patel .................. H05K 7/20445
165/185
2002/0047193 A1 * 4/2002 Dorfler ................. H01L 23/367
257/687
(Continued)

*Primary Examiner* — Dion R Ferguson
*Assistant Examiner* — Amir Jalali
(74) *Attorney, Agent, or Firm* — Kilpatrick Townsend & Stockton

(57) ABSTRACT

Electronic devices have a PCB with a heat-generating component (e.g., POP or SOC), a heat sink, and an EMI shielding structure. A combination structure can include a top heat spreader/EMI shield located above and in thermal contact with the POP/SOC top, a bottom heat spreader/EMI shield located below and in thermal contact with the POP/SOC bottom, and a heat-directing component located on the PCB, laterally surrounding a majority of the POP/SOC sides, and between and in thermal contact with the top and bottom heat spreaders. Resulting heat paths for the POP/SOC include one through its top to the top heat spreader, another through its bottom to the bottom heat spreader, and others through its sides through the PCB through the heat-directing component to the top and bottom heat spreaders. The heat-directing component can be a metal horseshoe shaped pad integrally formed onto the PCB.

20 Claims, 9 Drawing Sheets

(51) Int. Cl.
*H05K 9/00* (2006.01)
*H05K 1/02* (2006.01)

(52) U.S. Cl.
CPC ......... *H05K 9/0049* (2013.01); *H05K 1/0206* (2013.01); *H05K 2201/066* (2013.01); *H05K 2201/0715* (2013.01); *H05K 2201/10416* (2013.01)

(58) Field of Classification Search
CPC .... H05K 1/0204; H05K 1/021–1/0212; H05K 2201/06; H05K 2201/10416; H05K 2201/066
USPC ........................ 361/709–712, 715, 718–719; 257/712–719; 165/80.2; 174/252, 174/547–548
See application file for complete search history.

(56) References Cited

U.S. PATENT DOCUMENTS

| | | | | |
|---|---|---|---|---|
| 2002/0109226 | A1* | 8/2002 | Khan | H01L 23/13 257/737 |
| 2003/0156386 | A1* | 8/2003 | Summers | H05K 1/0204 361/719 |
| 2003/0184969 | A1* | 10/2003 | Itabashi | H05K 1/0206 361/688 |
| 2005/0018411 | A1* | 1/2005 | Lum | H05K 7/20436 361/800 |
| 2010/0142115 | A1* | 6/2010 | Bae | H01G 4/232 361/271 |
| 2011/0155445 | A1* | 6/2011 | Kwon | H04B 15/04 174/384 |
| 2012/0300405 | A1* | 11/2012 | Weeber | H01L 23/552 361/709 |
| 2013/0050962 | A1* | 2/2013 | Kratzer | H05K 9/0028 361/752 |
| 2013/0068509 | A1* | 3/2013 | Pyeon | H01L 23/13 174/252 |
| 2013/0308274 | A1* | 11/2013 | Murdock | H05K 7/205 361/717 |
| 2014/0061893 | A1* | 3/2014 | Saeidi | H01L 23/16 257/712 |
| 2014/0160684 | A1* | 6/2014 | Wittenberg | H05K 1/0203 361/719 |
| 2015/0201499 | A1* | 7/2015 | Shinar | H05K 3/125 425/132 |
| 2015/0243609 | A1* | 8/2015 | Lamorey | H01L 23/642 361/717 |
| 2016/0135282 | A1* | 5/2016 | Hata | H05K 1/0207 361/720 |
| 2016/0302312 | A1* | 10/2016 | Vinciarelli | H01R 43/205 |

* cited by examiner

COMBINATION PARALLEL PATH HEATSINK AND EMI SHIELD

FIELD

The described embodiments relate generally to electronic devices, and more particularly to thermal management features for electronic devices.

BACKGROUND

As electronic devices are becoming increasingly faster and more powerful, they are also becoming sleeker and smaller in size. Consumer preferences and demands tend to drive both of these trends toward faster and smaller. Electronic device makers are thus often faced with the challenges of incorporating the latest electronic chips and circuitry in their newest electronic device offerings, while doing so in the smallest volumes possible.

Amongst many factors to consider in this endeavor, electronic devices contain components that produce heat during normal operation. As such, fans, heat sinks, and other heat diversion components are a well-known and common part of the electronics landscape. As might be expected though, increasingly faster and more powerful chips and integrated circuitry can generate more heat than previous generations of electronics. Coupled with the desire to put these components into smaller overall volumes, this can create new challenges. Existing thermal management features and techniques can sometimes be inferior or weak in the face of increasing demands to account for more heat using less volume than before. Even where minimal thermal requirements are met for a given electronic device, the overall performance of the device can be enhanced where its generated heat is well dispersed beyond the minimums that are required.

Electromagnetic interference ("EMI") shielding is also an important consideration for electronic device design. Accounting for this protection for the various electronic components within a device must still typically be made even as device size becomes more compact.

There is a need for improved heat dissipation and/or EMI shielding features and techniques in electronic devices.

SUMMARY

Representative embodiments set forth herein disclose various features and techniques for managing heat dissipation and/or EMI shielding in an electronic device. In particular, the disclosed embodiments set forth a heat sink structure configured to dissipate heat from a heat-generating component within an electronic device, such as a system on chip ("SOC") or other processor on a printed circuit board ("PCB"). The heat sink structure can include one or more heat spreaders, a heat-directing component, and/or the portion of the PCB between the heat-generating component and the heat-directing component. The heat sink structure can be in thermal contact with and surround the heat-generating component at its top surface, bottom surface, and a majority of its side surfaces. In addition, the heat spreaders and the PCB can include features that provide EMI shielding to the various components on the PCB.

According to various embodiments, a heat sink structure can include a top heat spreader located above, a bottom heat spreader located below, and/or a heat-directing component located on a PCB with a heat-generating component. Resulting heat paths for the heat-generating component include one through its top to the top heat spreader, another through its bottom to the bottom heat spreader, and others through its sides through the PCB through the heat-directing component to the top and bottom heat spreaders. The heat-directing component can be a metal horseshoe shaped pad integrally formed onto the PCB that surrounds three sides of the heat-generating component. The PCB can include EMI frame walls that extend to the top and bottom metal heat spreaders to form Faraday cages therewith.

This Summary is provided merely for purposes of summarizing some example embodiments so as to provide a basic understanding of some aspects of the subject matter described herein. Accordingly, it will be appreciated that the above-described features are merely examples and should not be construed to narrow the scope or spirit of the subject matter described herein in any way. Other features, aspects, and advantages of the subject matter described will become apparent from the following Detailed Description, Figures, and Claims.

Other aspects and advantages of the embodiments described herein will become apparent from the following detailed description taken in conjunction with the accompanying drawings which illustrate, by way of example, the principles of the described embodiments.

BRIEF DESCRIPTION OF THE DRAWINGS

The included drawings are for illustrative purposes and serve only to provide examples of possible structures and arrangements for the disclosed features and techniques for managing heat dissipation and EMI shielding in an electronic device. These drawings in no way limit any changes in form and detail that may be made to the embodiments by one skilled in the art without departing from the spirit and scope of the embodiments. The embodiments will be readily understood by the following detailed description in conjunction with the accompanying drawings, wherein like reference numerals designate like structural elements.

DETAILED DESCRIPTION

Figure 1:
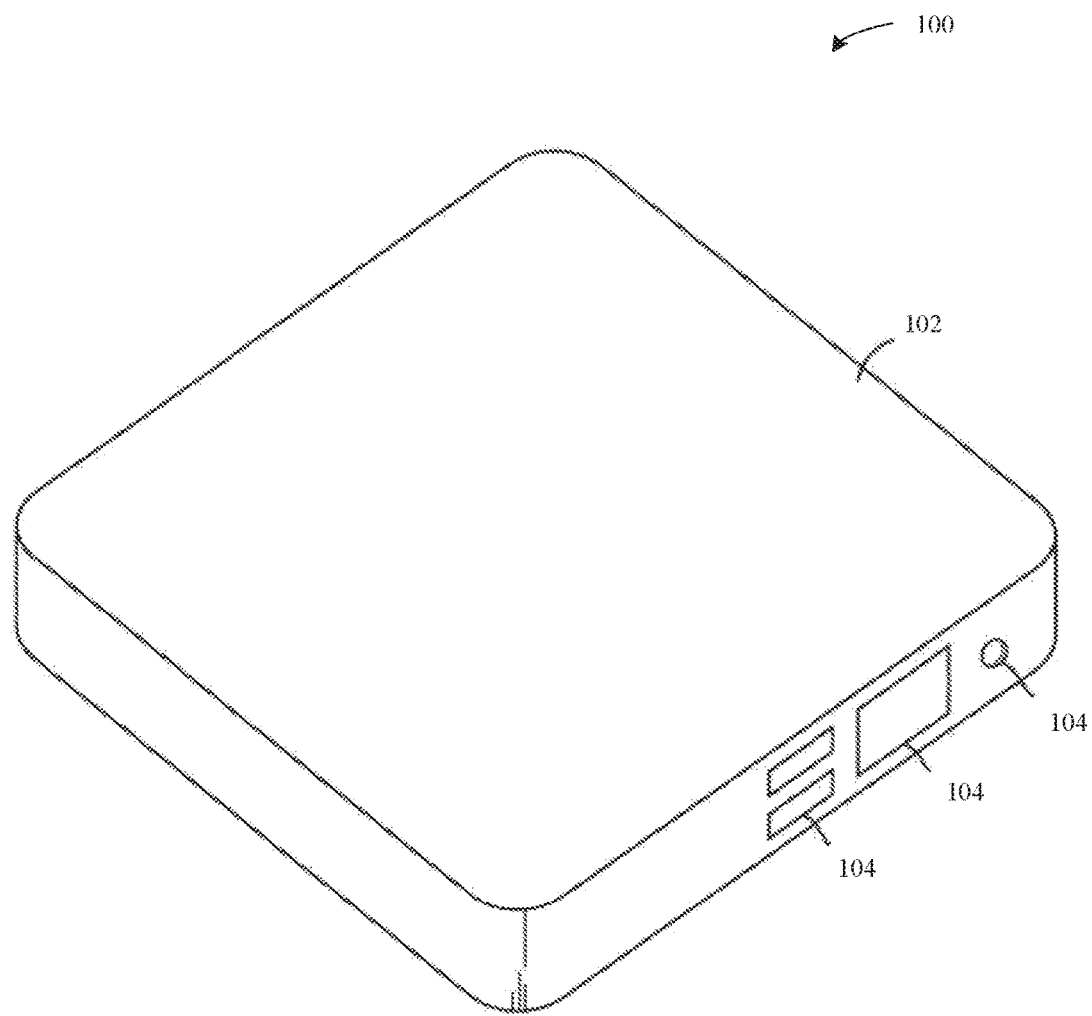
FIG. 1 illustrates in top perspective view an exemplary electronic device according to various embodiments of the present disclosure.

Representative applications of apparatuses and methods according to the presently described embodiments are provided in this section. These examples are being provided solely to add context and aid in the understanding of the described embodiments. It will thus be apparent to one skilled in the art that the presently described embodiments can be practiced without some or all of these specific details. In other instances, well known process steps have not been described in detail in order to avoid unnecessarily obscuring the presently described embodiments. Other applications are possible, such that the following examples should not be taken as limiting.

Electronic devices contain components that produce heat during normal operation. As such, fans, heat sinks, and other heat diversion components are a well-known and common part of the electronics landscape. EMI shielding is also an important consideration for electronic device design. As might be expected though, increasingly faster and more powerful chips and integrated circuitry can generate more heat than previous generations of electronics. Coupled with the desire to put these components into smaller overall volumes for newer and sleeker electronic devices, this can create new challenges.

Accordingly, the embodiments set forth herein provide various improved features and techniques for managing heat dissipation and/or EMI shielding in an electronic device. The disclosed embodiments set forth a heat sink structure configured to dissipate heat from a heat-generating component within an electronic device. This can include a heat-directing component that transmits laterally-directed heat from the heat-generating component. According to various detailed embodiments, the heat sink structure can include a top heat spreader located above and in thermal contact with the heat-generating component, a bottom heat spreader located below and in thermal contact with the heat-generating component, and/or a heat-directing component located on a PCB with the heat-generating component, laterally surrounding one or more of the heat-generating component sides. In some embodiments, the heat-directing component can surround a majority of the heat-generating component sides, and/or can be between and in thermal contact with the top and bottom heat spreaders. Resulting heat paths for the heat-generating component include one through its top to the top heat spreader, another through its bottom to the bottom heat spreader, and others through its sides through the PCB through the heat-directing component to the top and bottom heat spreaders. The heat-directing component can be a metal horseshoe shaped pad integrally formed onto the PCB. In some embodiments, one or more of the PCB and the top and bottom heat spreaders can include EMI shielding features and capabilities. In some embodiments, only heat sink structure components without particular EMI features may be used.

The foregoing approaches provide features and techniques for managing heat dissipation and EMI shielding in an electronic device. A more detailed discussion of these features and techniques is set forth below and described in conjunction with FIGS. 1-9, which illustrate detailed diagrams of devices and components that can be used to implement these features and techniques.

Turning first to FIG. 1, an exemplary electronic device according to various embodiments of the present disclosure is illustrated in top perspective view. Electronic device 100 of FIG. 1 may be a computer, a set-top box, a wireless access point, a portable electronic device, or any other suitable electronic device or piece of equipment. In various embodiments, electronic device can be a digital media extender (e.g., an Apple TV®), for example. Electronic device 100 may have an outer housing 102, which may be formed from materials such as plastic, glass, ceramic, metal, carbon fiber, fiberglass, and other fiber composites, other materials, or combinations of these materials, for example. Housing 102 may have one or more parts, such as, for example, mating upper and lower parts formed from plastic or other housing materials. If desired, housing 102 may have more than two parts.

In the configuration shown in FIG. 1, housing 102 of electronic device 100 has a rectangular box shape with planar upper and lower surfaces and four perpendicular (vertical) planar sidewalls, and the corners of housing 102 may be rounded. It will be readily appreciated that the example of FIG. 1 is merely illustrative, such that other shapes may be used for housing 102 if desired (e.g., shapes with curved sides, shapes with circular footprints, shapes with combinations of curved and straight edges and surfaces, etc.). To accommodate connectors for displays, device peripherals, power cables, and other accessories, housing 102 may have openings (e.g., port openings) such as openings 104. Electronic device 100 may also contain internal electronic components, such as integrated circuits and other components that may generate heat and that may benefit from EMI shield protection. Thermal management and EMI shielding features may thus be incorporated into the internal structures of electronic device 100, as set forth in greater detail below.

Figure 2A:
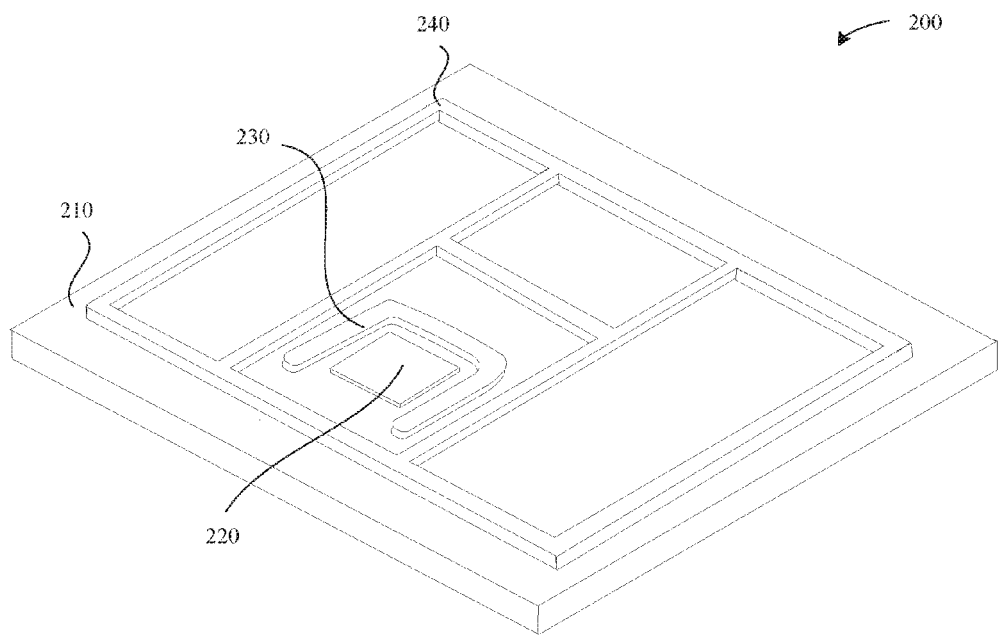
FIG. 2A illustrates in top perspective view an exemplary printed circuit board having heat sink and EMI shielding features thereon according to various embodiments of the present disclosure.
Figure 2B:
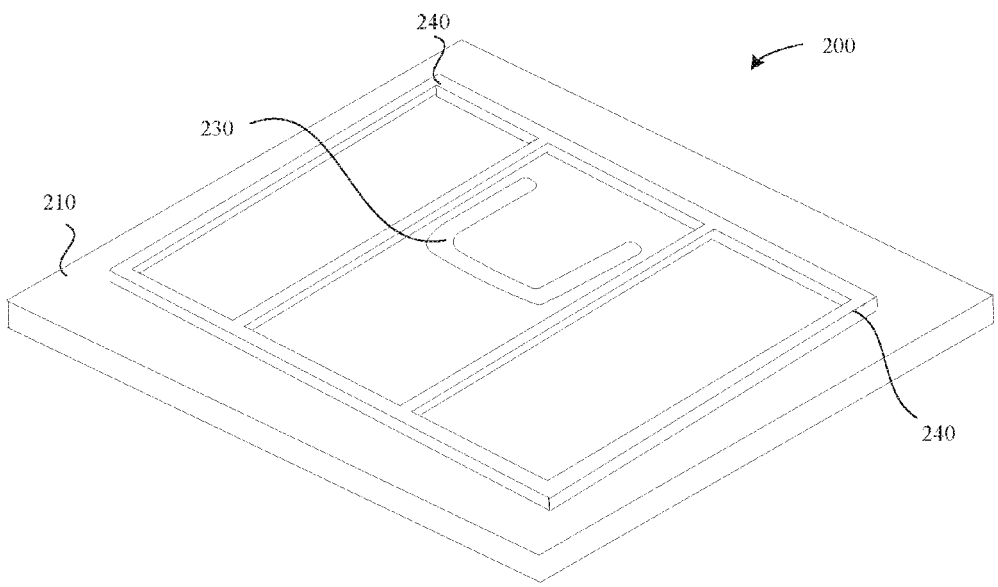
FIG. 2B illustrates in bottom perspective view the exemplary printed circuit board of FIG. 2A according to various embodiments of the present disclosure.

Moving next to FIGS. 2A and 2B, an exemplary printed circuit board having heat sink and EMI shielding features thereon is depicted in top and bottom perspective views respectively. As illustrated in FIGS. 2A and 2B, arrangement 200 can have a various electronic components and can be included within an outer housing of an electronic device, such as that which is shown and described above for electronic device 100. Arrangement 200 can include a PCB 210 having a heat-generating component 220, which can take the form of a variety of electronic components, such as, for example, a SOC or other processor and associated package. In various embodiments, the heat-generating component 220 can be a package on package ("POP") arrangement, which can include an SOC and memory component together. In some embodiments, the relevant POP, SOC package, or other heat-generating component 220 can have relatively poor thermal paths through its top and bottom surfaces, which can be typical for complex packages such as a POP or SOC. Heat-generating component 220 can generally define atop surface, a bottom surface, and one or more side surfaces. In various embodiments, this can include four side surfaces, such as where the heat-generating component 220 is in a cube or box shape. In some embodiments, the PCB 210 can be a multi-layered PCB ("MLB"), among other possible arrangements. One or more additional processors and/or other electronic components can also be distributed across the MLB or other PCB 210.

A heat-directing component 230 can be located in close proximity to the processor or other heat-generating component 220. In some embodiments, this heat-directing component 230 can take the form of a copper or other metal pad that is integrally formed with the PCB 210. Heat-directing component 230 can be a heat-directing pad that surrounds one, some, or a majority of the one or more heat-generating component side surfaces, and can extend from the top surface, the bottom surface, neither surface, or both the top and bottom surfaces of the PCB 210. In some embodiments, heat-directing component 230 can form a horseshoe shape that surrounds the heat-generating component 220 on all but one side, such as on three sides, as shown. In various embodiments, heat-directing component 230 might surround or be proximate to only one or more heat-generating component side surfaces, which may be less than a majority of the side surfaces of heat-generating component 220. Furthermore, heat-directing component 230 may exist at only one surface of PCB 210, or may have different shapes and/or dimensions at the top and bottom surfaces of PCB 210. In such instances, heat-directing component 230 can be considered to be two different heat-directing components, such as a first heat-directing component at a top surface of PCB 210 and a second heat-directing component at a bottom surface of PCB 210. For example, heat-directing component 230 might form an increased thickness horseshoe shape that extends from a top surface of PCB 210, and also might form a reduced thickness L-shape that is flush with but does not extend from a bottom surface of PCB 210. Other variations are also possible. POP, SOC, or other heat-generating component 220 can generate heat during normal operation of the electronic device, and a portion of this heat can travel through one or more heat paths through the portions of the PCB 210 that immediately surround the heat-generating component. The horseshoe copper pad or other heat-directing component 230 then directs heat that comes from the POP, SOC, or other heat-generating component 220 via the PCB 210 away from the remainder of the PCB 210, such as into one or more heat spreaders that are located above and/or below the heat-generating component 220 and the heat-directing component 230, as set forth in greater detail below.

Because the processor or other heat-generating component 220 is surrounded in close proximity on all sides but one, or alternatively, the majority of its side surfaces, by the heat-directing component 230, the various electrical connections and footprint on PCB 210 are arranged such that electrical access and the electrical connections to heat-generating component 220 are all or substantially all along the only the one or minority open or exposed side. As such, the PCB 210 and the heat-generating component 220 layouts are designed with configurations that account for this significant alternative arrangement for purposes of heat management.

In addition to various other electronic components, PCB 210 can also feature a plurality of EMI frame walls 240 that extend away from both the top and bottom surfaces of the PCB 210. These EMI frame walls 240 can surround some or all of the various other electronic components on the PCB 210, and the EMI frame walls 240 can also comprise metal, such as copper or aluminum, that is integrally formed with the PCB 210. When acting in conjunction with one or more heat spreaders and/or other suitable components located above and/or below the PCB 210, these EMI frame walls 240 can help to provide one or more Faraday cages that provide EMI shielding for the surrounded electronic components on the PCB 210.

Figure 3:
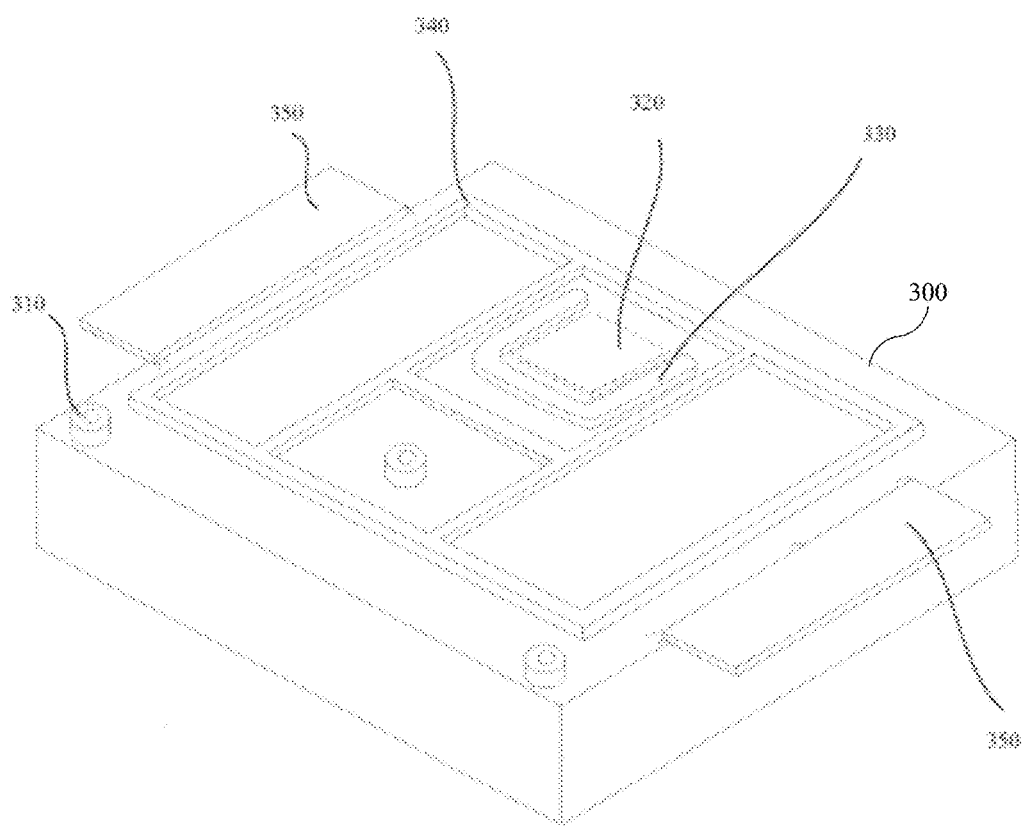
FIG. 3 illustrates in bottom perspective view a top heat spreader according to various embodiments of the present disclosure.

Continuing with FIG. 3, a top heat spreader according to various embodiments of the present disclosure is illustrated in bottom perspective view. Top heat spreader 300 can generally define a larger or the same overall area than the area defined by PCB 210, and can be designed to overlap all or most of the PCB. Top heat spreader 300 can include various top coupling features 310 to allow coupling to other electronic device components, such as PCB 210, outer housing 102, and/or a bottom heat spreader (below), among other possible components. A top pedestal 320 with a thermal interface can be configured to contact directly the top surface of heat-generating component 220, while a top horseshoe shaped pedestal 330 with a thermal interface can be configured to contact directly a top surface of heat-directing component 230. A plurality of top EMI gaskets 340 can be configured to contact directly upper edge portions of the EMI frame walls 240 that extend above PCB 210, while one or more top side wings 350 with thermal interfaces can be configured to contact directly corresponding bottom side wings on a bottom heat spreader, as set forth below. Each of top pedestal 320, top horseshoe shaped pedestal 330, top EMI gaskets 340, and/or top side wings 350 can be particularly shaped so as to match or substantially match the shapes of the various components that they contact directly, since it is specifically contemplated that these various matching contact points or surfaces are to provide paths for heat transfer and/or enclosure seams for EMI shielding. As will be readily appreciated, direct contact of the various components may not always be necessary, and the presence of one or more intervening gaskets, films, or other components may also be used.

Figure 4:
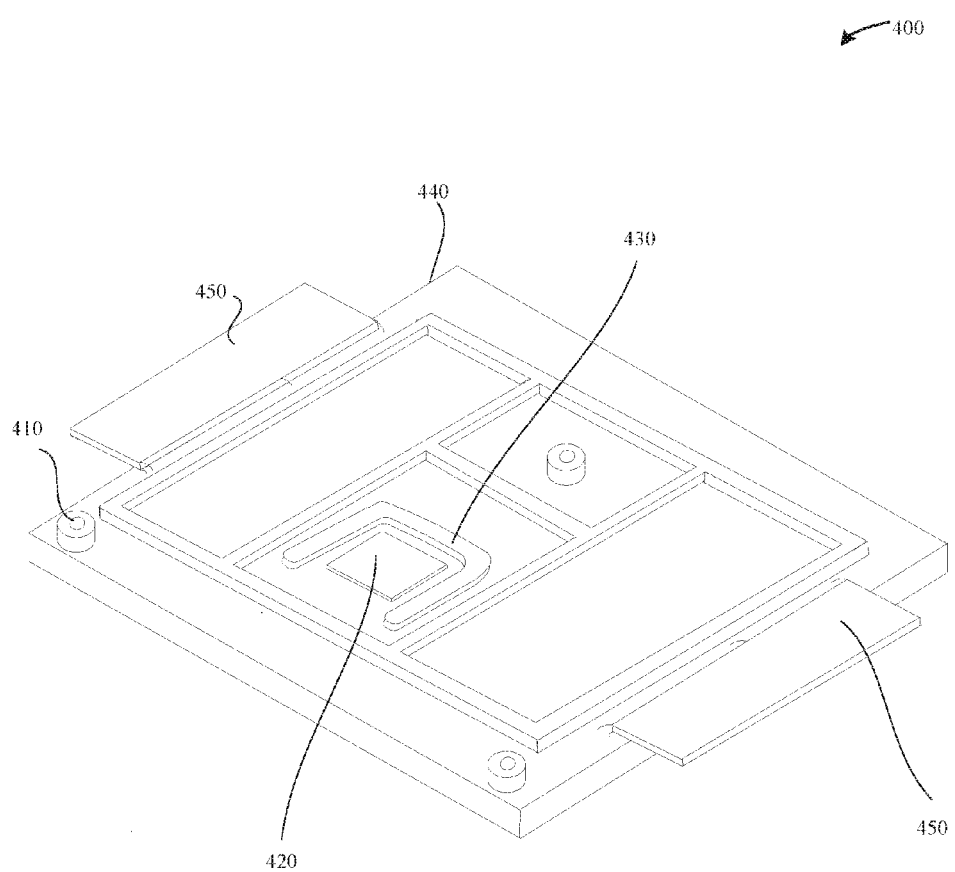
FIG. 4 illustrates in top perspective view a bottom heat spreader according to various embodiments of the present disclosure.

FIG. 4 illustrates in top perspective view a bottom heat spreader according to various embodiments of the present disclosure. Bottom heat spreader 400 can be similar to top heat spreader 300 in a variety of ways. Bottom heat spreader 400 can also define a somewhat larger overall area than the area defined by PCB 210, and can be designed to overlap all or most of the PCB. Bottom heat spreader 400 can include various bottom coupling features 410 that allow coupling to other electronic device components, such as PCB 210, outer housing 102, and/or top heat spreader 300, among other possible components. A bottom pedestal 420 with a thermal interface can be configured to contact directly the bottom surface of heat-generating component 220, while a bottom horseshoe shaped pedestal 430 with a thermal interface can be configured to contact directly a bottom surface of heat-directing component 230. A plurality of bottom EMI gaskets 440 can be configured to contact directly lower edge portions of the EMI frame walls 240 that extend below PCB 210, while one or more bottom side wings 450 can be configured to contact directly corresponding top side wings 350 on top heat spreader 300. Again, each of bottom pedestal 420, bottom horseshoe shaped pedestal 430, bottom EMI gaskets 440, and bottom side wings 450 can be particularly shaped so as to match or substantially match the shapes of the various components that they contact directly, since it is specifically contemplated that these various matching contact points or surfaces are to provide paths for heat transfer and/or enclosure seams for EMI shielding. Again and as above, direct contact of the various components may not always be necessary, and the presence of one or more intervening gaskets, films, or other components may also be used.

Top heat spreader 300 and bottom heat spreader 400 can both be formed from metal, for example, such as cast and/or machined aluminum, and may be anodized, painted and/or otherwise coated with one or more coverings or coatings. Each of the various thermal interfaces and EMI gaskets that may be used with top heat spreader 300 and bottom heat spreader 400 can be glued or otherwise coupled to their respective heat spreaders, and can be formed from one or more suitable materials. For example, the thermal interfaces at the top pedestal 320, bottom pedestal 420, top horseshoe shaped pedestal 330, bottom horseshoe shaped pedestal 430, and top side wings 350 can be formed from a silicone or thermoplastic material, while the top EMI gaskets 340 and bottom EMI gaskets 440 can be formed from a metal fabric material.

Since the heat-directing component 230, the top heat spreader 300, and the bottom heat spreader 400 can all be formed from copper, aluminum, and/or other suitable metals, these components provide favorable thermal paths for the transfer of heat from the POP, SOC, or other heat-generating component 220. Of course, other suitably favorable metals or materials with respect to providing thermal paths may also be used in the construction of these components. In particular, these components provide thermal paths that are more favorable than that which is provided by typical PCB materials, such as that which is contained in PCB 210. It will be readily appreciated that some portion of heat from heat-generating component 220 travels laterally from the side walls or surfaces of the heat-generating component 220 and through the immediately surrounding portions of PCB 210 until the heat arrives at heat-directing component 230 in short order. According to the materials used in the various components, as noted above, this heat then tends toward the more favorable heat paths through the heat-directing component 230, top heat spreader 300, and bottom heat spreader 400, rather than continuing on through the rest of PCB 210.

Added protection is thus provided to the various electronic components that are distributed elsewhere throughout PCB 210 by diverting laterally travelling heat away from the PCB 210 at heat-directing component 230. Again, this heat-directing component 230 can form a horseshoe shape that is in close proximity to and surrounds the heat-generating component 220 on all sides or all but one side, such as on three of four sides. Another benefit that is realized by the use of the foregoing heat sink structure is that the height or "Z-stack" dimension of the overall electronic device 100 can be reduced. Where a traditional heat sink arrangement or structure is used instead of the foregoing heat sink structure, more heat sinking material would be needed above and below the heat-generating component 220, which in turn would result in a taller overall device.

Figure 5:
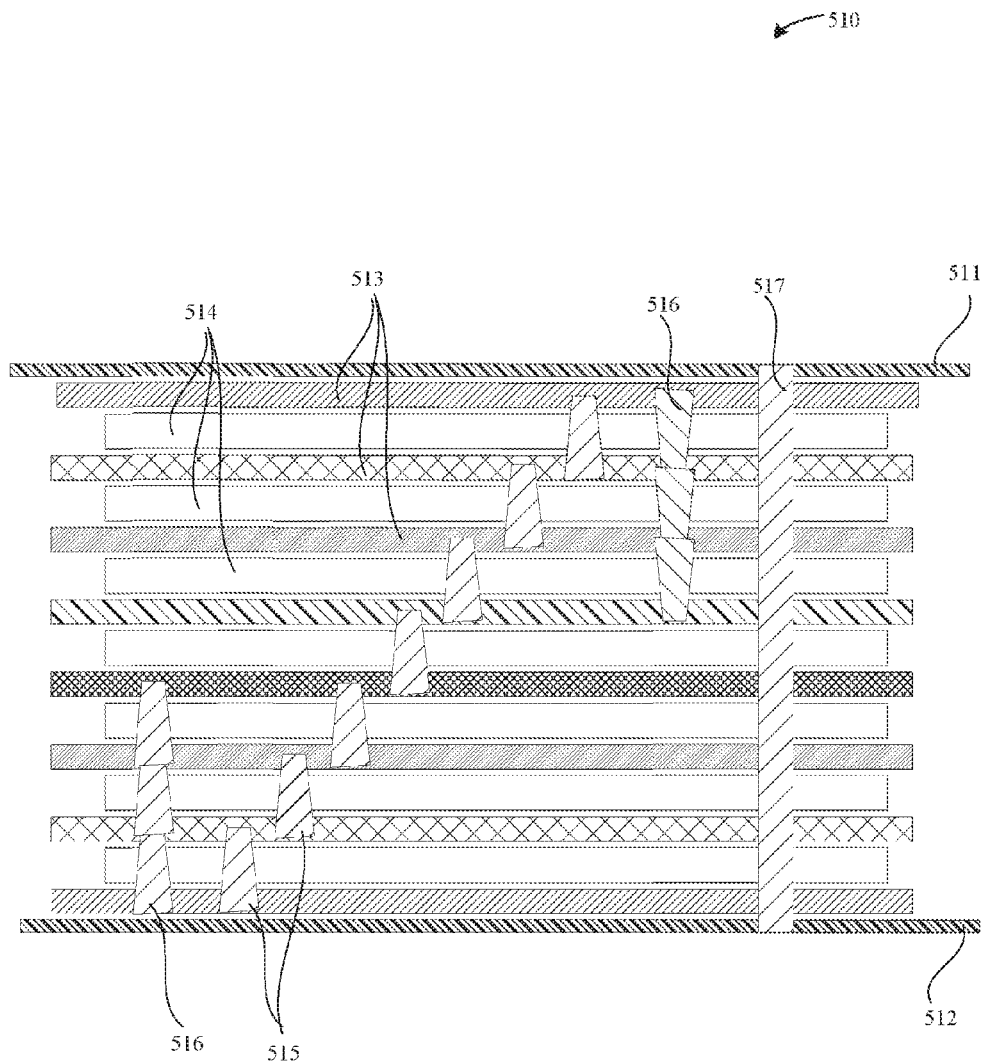
FIG. 5 illustrates in side cross-sectional view a printed circuit board having heat-directing vias therein according to various embodiments of the present disclosure.

Turning next to FIG. 5, a printed circuit board having heat-directing vias therein is illustrated in side cross-sectional view. PCB 510 can include a top soldermask 511, a bottom soldermask 512, a plurality of metallized or conductive layers 513, and a plurality of dielectric layers 514. One or more vias 515 can couple one conductive layer 513 to another conductive layer, and one or more multi-layer vias 516 can couple more than two conductive layers 513. A full length via 517 can couple all layers 513, 514 and extend from a top surface of top soldermask 511 to a bottom surface of bottom soldermask 512. Each of vias 515, multi-layer vias 516, and full length via 517 can thermally couple multiple conductive layers 513, such that heat is thereby directed from one layer to another through the via. Accordingly, each via can be formed from a suitable thermally conductive material, such as a metal. In various embodiments, heat-directing vias 515, 516, 517 can be formed from copper. In various embodiments, PCB 510 can be designed with such heat directive vi as 515, 516, 517 in strategic locations, so as to direct heat through and about the PCB in a desired manner. Furthermore, one, some, or all of the heat-directing vias 515, 516, 517 can also be used for electrical connections as well as to direct heat, while others of the heat-directing vias 515, 516, 517 may be used only to direct heat and not for electrical purposes. In various embodiments, one or more of dielectric layers 514 may have more and/or a higher concentration of vias that are both heat directing and electrically conducting. For example, the dielectric layers 514 that are closer to the surface of PCB 510 may have more electrically-conductive heat-directing vias and other similar electrical connections with heat-generating components.

Figure 6:
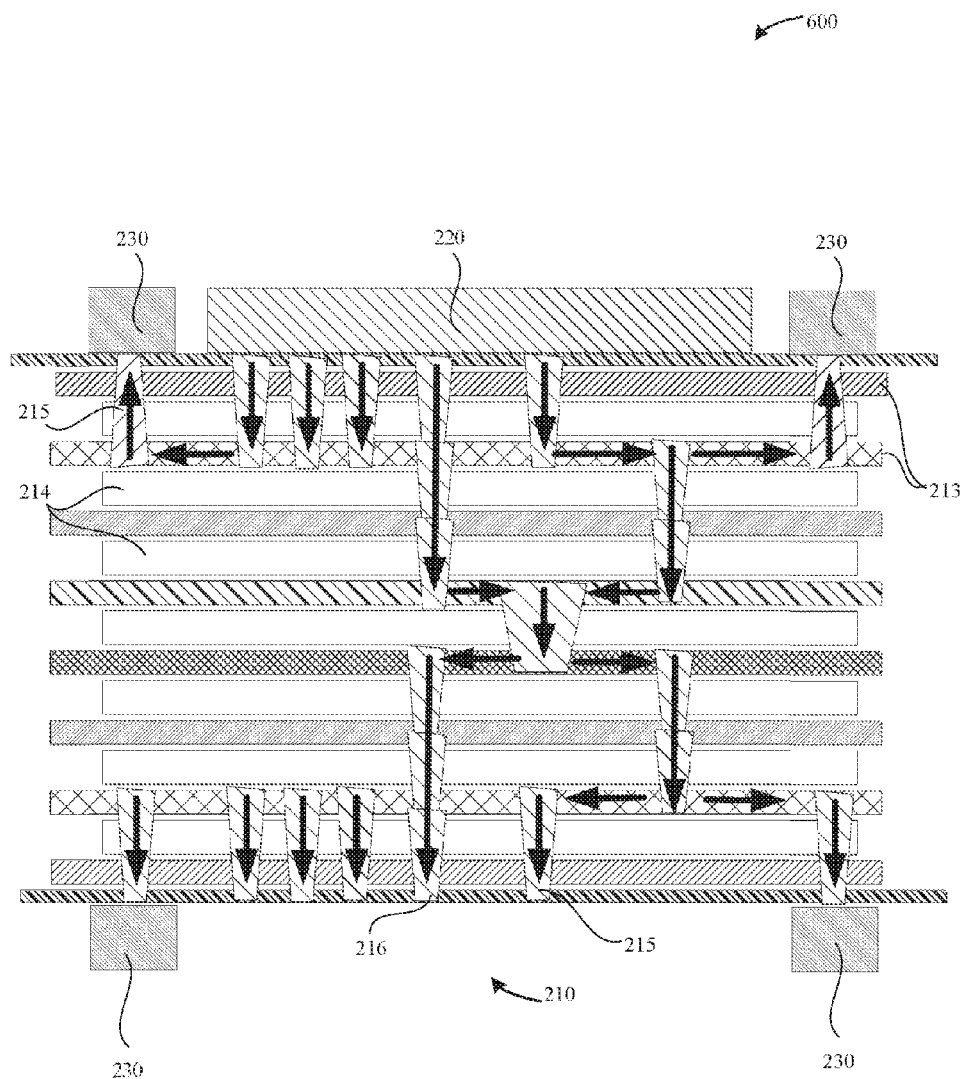
FIG. 6 illustrates in side cross-sectional view an assembly comprising a heat-generating component, a heat-directing component, and a printed circuit board having heat-directing vias therein according to various embodiments of the present disclosure.

FIG. 6 illustrates in side cross-sectional view an assembly comprising a heat-generating component, a heat-directing component, and a printed circuit board having heat-directing vias therein according to various embodiments of the present disclosure. Assembly 600 can be similar to that which is shown in PCB 510 above, in that the subject PCB 210 can have multiple layers 213, 214 and heat-directing vias 215, 216. Similar to the foregoing example, heat-directing vias 215 can thermally couple two conductive layers 213, while stacked heat-directing vias 216 can thermally couple more than two conductive layers 213. As shown, arrows within and about the vias 215, 216 generally represent the flow of heat through the PCB 210.

PCB can include a heat-generating component 220, such as a POP or an SOC, and one or more heat-directing components 230. As in the foregoing examples, heat-directing component 230 can be a metal pad formed in the shape of a horseshoe or other suitable shape. Heat-directing vias 215, 216 can be formed in strategic locations, such that heat is directed from the heat-generating component 220 through the PCB 210 to heat-directing component 230 and/or one or more alternatively desired locations. As will be readily appreciated, conductive layers 213 can be more conducive to conducting and transferring heat, while insulating or dielectric layers 214 are not so thermally conductive. Accordingly, PCB 210 can include a plurality of heat-directing vias 215, 216 thermally coupling two or more layers of the PCB in order to direct heat therethrough in a desired manner. In particular, the heat-directing vias 215, 216 can be arranged to direct heat from a first PCB surface region (such as at heat-generating component 220) through the PCB 210 to a second printed circuit board surface region (such as at horseshoe shaped pad or other suitable heat-directing component 230). This can be accomplished by channeling or otherwise directing the heat toward and through one or more conductive layers 213 within the PCB 210, as shown. Again, this can be done through the use of heat-directing vias 215, 216 made from copper or any other suitable heat transferring material. Again, one, some, or all of heat-directing vias 215, 216 may also be electrically conducting, such as to provide electrical connectivity between components on the different conductive layers 213 and/or heat-generating component 220, if applicable.

Figure 7:
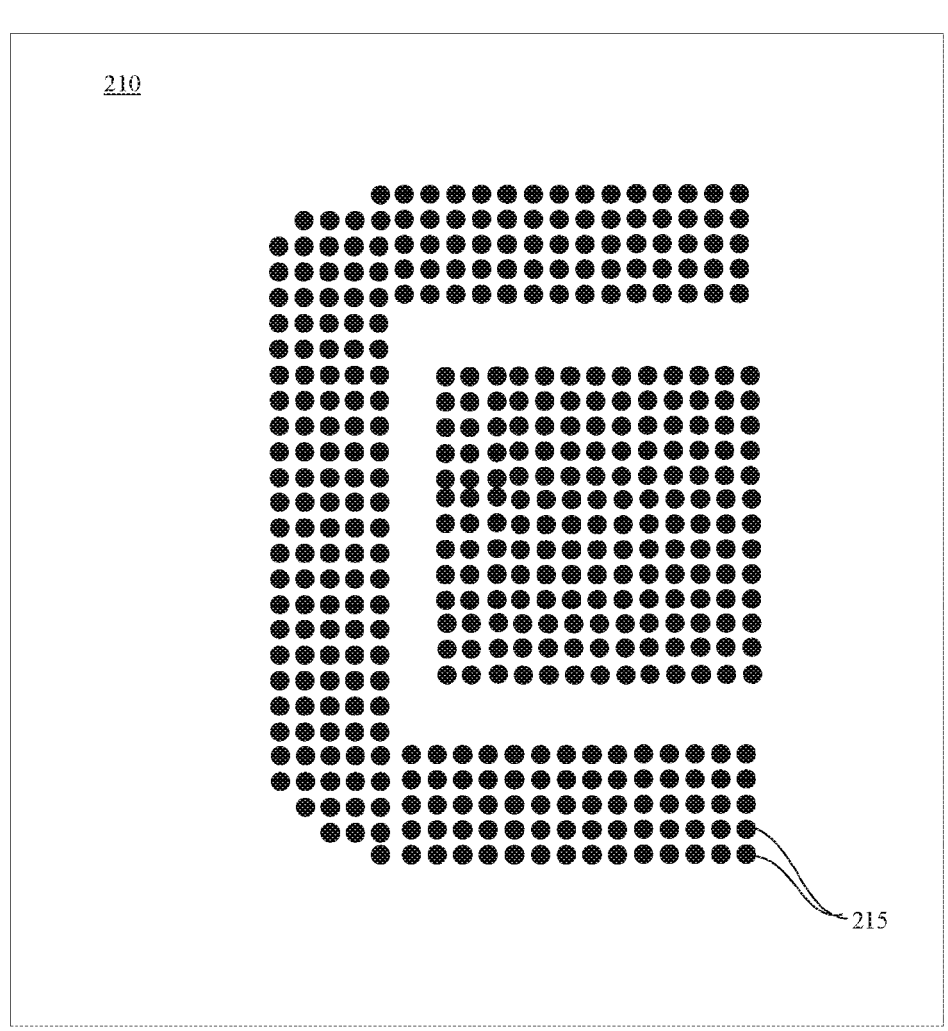
FIG. 7 illustrates in top plan view a printed circuit board having heat-directing vias therein according to various embodiments of the present disclosure.

FIG. 7 illustrates in top plan view a printed circuit board having heat-directing vias therein according to various embodiments of the present disclosure. As shown, arrangement 700 depicts a top surface of PCB 210 without the heat-generating component (e.g., POP or SOC) or heat-directing component (e.g., horseshoe shaped pad) coupled thereto. Many vias 215 can be seen at the top surface of PCB 210, and it will be readily appreciated that these vias 215 can be arranged so as to direct heat away from a heat-generating component and to a heat-directing component. As such, heat can enter PCB 210 through the many vias 215 that correspond to the footprint of the heat-generating component, where the heat then travels through PCB 210 in a manner such as that shown in FIG. 6. Heat then exits PCB 210 through the many vias 215 that correspond to the footprint of the heat-directing component. Of course, many other patterns and paths for heat to travel through a PCB can also be used, and it will be understood that the provided drawings and discussion represent only one particular example from a limitless number of possibilities.

Figure 8:
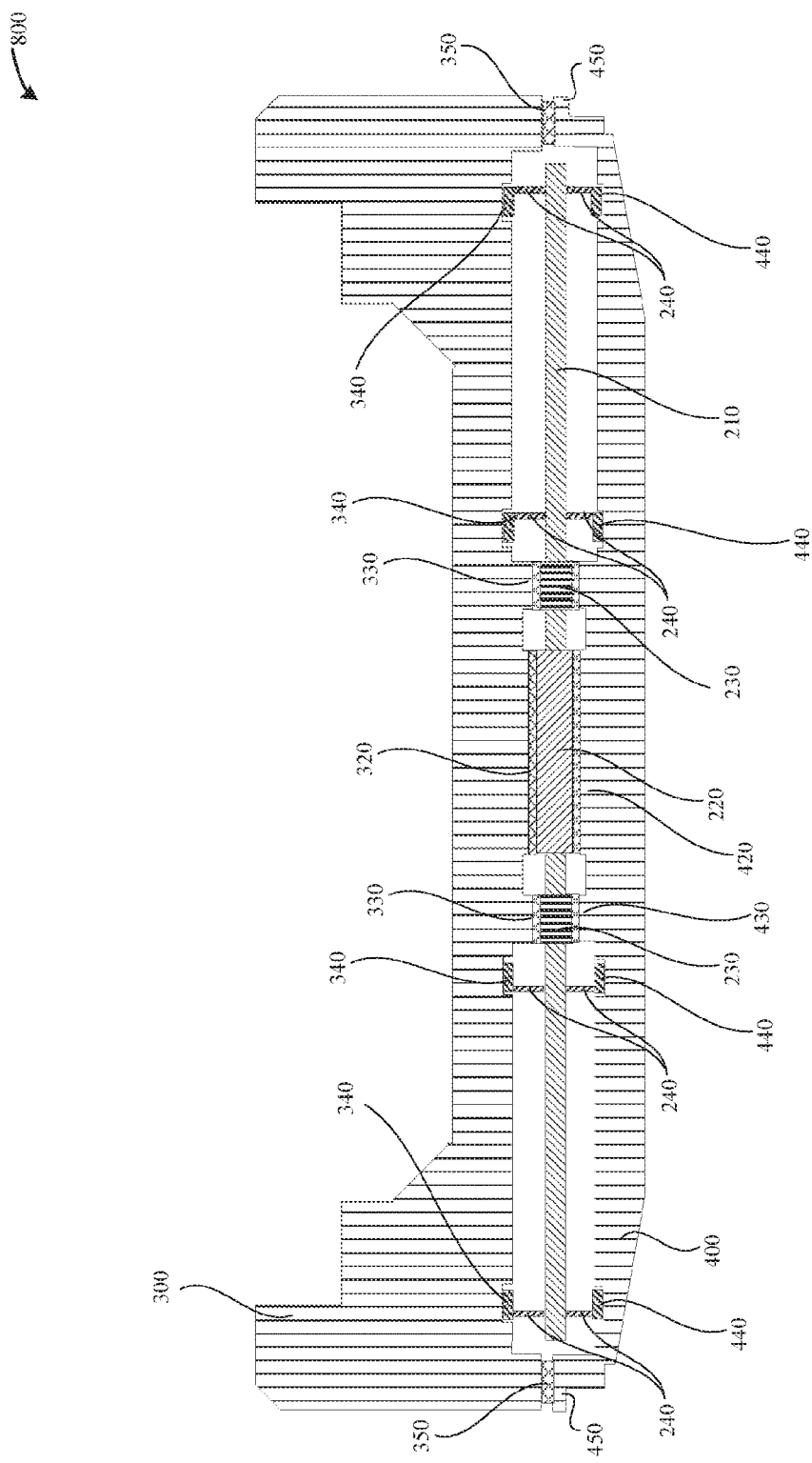
FIG. 8 illustrates in side cross-sectional view an assembly comprising the printed circuit board, top heat spreader, and bottom heat spreader of FIGS. 2-4 according to various embodiments of the present disclosure.

Moving next to FIG. 8, an assembly comprising the printed circuit board, top heat spreader, and bottom heat spreader of FIGS. 2-4 is illustrated in side cross-sectional view. As depicted in FIG. 5, arrangement or assembly 800 can include the printed circuit board 210 being sandwiched between the top heat spreader 300 and the bottom heat spreader 400. These three components can be coupled to each other through any suitable means, such as using those features shown above, and the resulting overall assembly 800 can then be included within the outer housing 102 (not shown) of electronic device 100. Locations of the various components and features relative to each other can be appreciated with respect to this cross-sectional view of assembly 800, which includes, among other components, heat-generating component 220, heat-directing component 230, and EMI frame walls 240 of PCB 210; top pedestal 320 with thermal interface, top horseshoe shaped pedestal 330 with thermal interface, top EMI gaskets 340, and top side wings 350 with thermal interfaces of top heat spreader 300; and bottom pedestal 420 with thermal interface, bottom horseshoe shaped pedestal 430 with thermal interface, bottom EMI gaskets 440, and bottom side wings 450 of bottom heat spreader 400.

Based on the structures shown and materials used, it will be appreciated that EMI shielding protection is provided for the various electronic components on PCB 210. Again, both top heat spreader 300 and bottom heat spreader are formed from aluminum or another suitable metal. As noted above, the EMI frame walls 240 are also metal, such as copper or aluminum, which can be integrally formed on the PCB 210, while the top EMI gaskets 340 and bottom EMI gaskets 440 can be formed from a metal fabric material. Accordingly, EMI shielding protection is provided through the creation of multiple Faraday cages, each of which can comprise (from top to bottom) top heat spreader 300, top EMI gasket 340, EMI frame walls 240, bottom EMI gasket 440, and bottom heat spreader 400. The combined use of the heat spreaders 300, 400 and other parts to provide EMI shielding as well thus results in the use of fewer overall parts for the electronic device, which also leads to a reduction in overall device dimensions, such as height.

Figure 9:
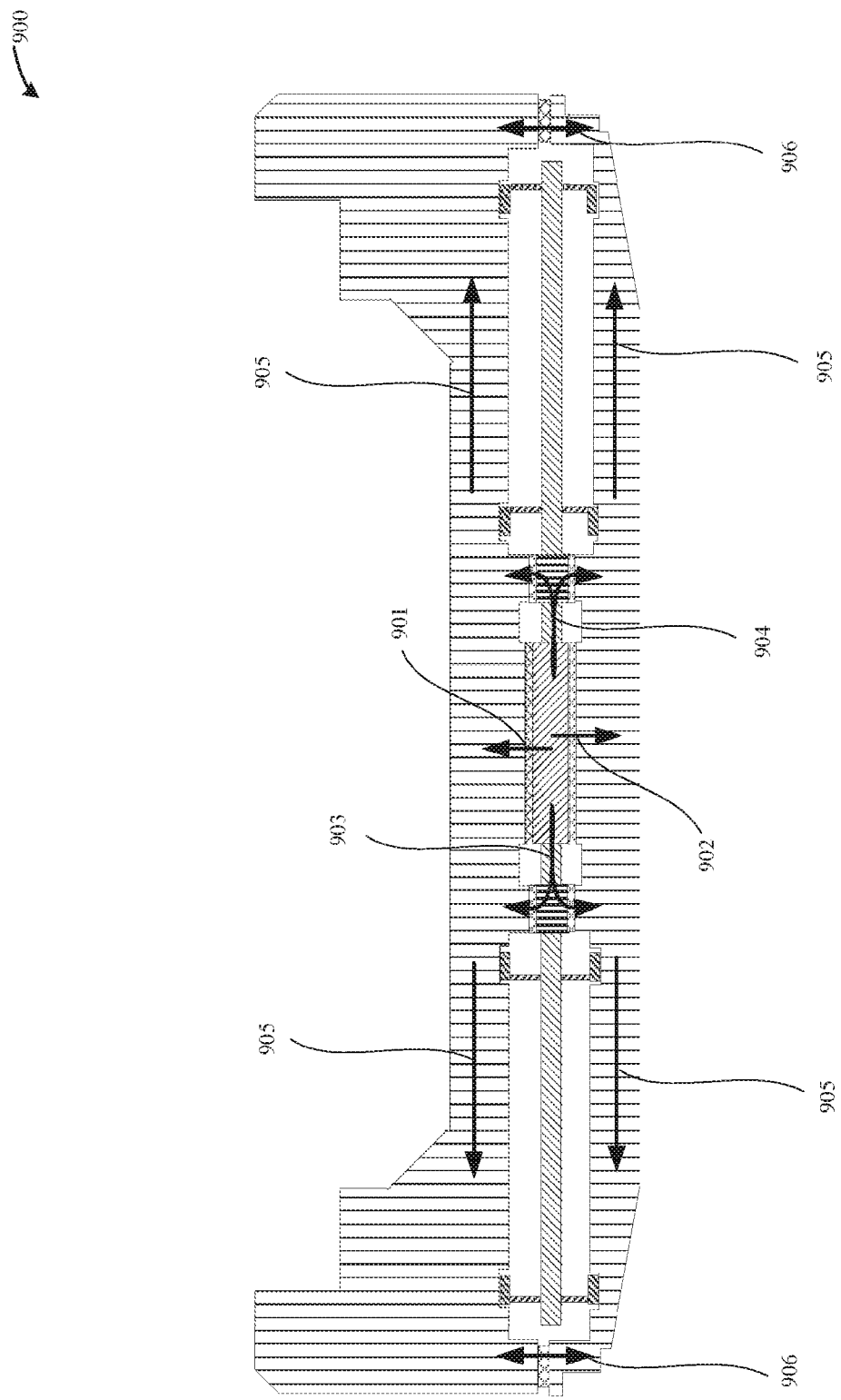
FIG. 9 illustrates in side cross-sectional view various heat paths in the assembly of FIG. 8 according to various embodiments of the present disclosure.

FIG. 9 also illustrates in side cross-sectional view various heat paths in the assembly of FIG. 8 according to various embodiments of the present disclosure. Assembly 900 is the exact same assembly with the same features as set forth in FIG. 9, and is repeated for purposes of illustration to discuss heat paths. As shown in FIG. 9, various parallel and mirrored heat paths can originate from the heat-generating component 220 at a central location of the PCB 210. Upward parallel heat paths can include heat path 901, which goes from the top surface of the heat-generating component 220 through the top pedestal 320 with thermal interface and into the top heat spreader 300, where the heat is then generally spread throughout, such as along upper heat paths 905. Upward parallel heat paths can also include the upward portions of heat paths 903 and 904, both of which first go laterally from side surfaces of the heat-generating component 220, through the PCB 210, and into the heat-directing component 230, where significant portions of the heat are then directed upward through the heat-directing component 230 and through the top horseshoe shaped pedestal 330 with thermal interface into the top heat spreader 300, where the heat is again then generally spread throughout, such as along upper heat paths 905.

Mirrored parallel heat paths also travel in a downward direction from the heat-generating component 220. As shown, downward parallel heat paths can include heat path 902, which goes from a bottom surface of the heat-generating component 220 through the bottom pedestal 420 with thermal interface and into the bottom heat spreader 400, where the heat is then generally spread throughout, such as along lower heat paths 905. Downward parallel heat paths can also include the downward portions of heat paths 903 and 904, bath of which first go laterally from side surfaces of the heat-generating component 220, through the PCB 210, and into the heat-directing component 230, where significant portions of the heat are then directed downward through the heat-directing component 230 and through the bottom horseshoe shaped pedestal 430 with thermal interface into the bottom heat spreader 400, where the heat is then generally spread throughout, such as along lower heat paths 905.

In addition to the various foregoing mirrored parallel heat paths 901-905, further heat paths 906 can also be located where the top side wings 350 and thermal interfaces meet the bottom side wings 450. The heat load or distribution on top heat spreader 300 and bottom heat spreader 400 can be balanced at these side wing locations, with heat traveling from the hotter heat spreader to the heat spreader having less heat, as will be readily appreciated.

The various aspects, embodiments, implementations or features of the described embodiments can be used separately or in any combination. The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. An electronic device, comprising: an outer housing arranged to enclose and support a plurality of internal components; a printed circuit board having a plurality of electronic elements located within the outer housing; a heat-generating component located on the printed circuit board, wherein the heat-generating component includes a top surface, a bottom surface, and multiple side surfaces; and a heat sink structure configured to dissipate heat from the heat-generating component, wherein the heat sink structure is in thermal contact with and surrounds the heat generating component at the top surface, the bottom surface, and a majority of the one or more side surfaces, wherein the heat sink structure includes a heat-directing pad extending normal to the printed circuit board, and wherein the heat-directing pad extends laterally about all but one side surface[s] of the heat generating component and is directly adjacent each side of the plurality of sides without intervening components.

2. The electronic device of claim 1, wherein the printed circuit board includes a plurality of electromagnetic interference ("EMI") shielding frame walls that extend away from both a top surface and a bottom surface of the printed circuit board.

3. The electronic device of claim 1, wherein the heat sink structure includes:
- a top heat spreader located above and in thermal contact with the heat-generating component top surface, the top heat spreader being adapted to provide EMI shielding for at least some of the electronic elements,
- a bottom heat spreader located below and in thermal contact with the heat-generating component bottom surface, the bottom heat spreader being adapted to provide EMI shielding for at least some of the electronic elements, and
- wherein the heat-directing pad is located on the printed circuit board and between and in thermal contact with the top heat spreader and the bottom heat spreader, and wherein the heat-directing pad directs heat from the printed circuit board into the top heat spreader and the bottom heat spreader.

4. The electronic device of claim 3, wherein the at least one heat-directing pad comprises a copper pad that is integrally formed on the printed circuit board and that surrounds the heat-generating component on three sides.

5. The electronic device of claim 3, wherein the printed circuit board includes a plurality of EMI frame walls that extend away from a top surface of the printed circuit board to contact the top heat spreader and away from a bottom surface of the printed circuit board to contact the bottom heat spreader to forth collectively one or more Faraday cages that surround the plurality of electronic elements.

6. The electronic device of claim 3, wherein the top heat spreader and the bottom heat spreader are formed from aluminum.

7. The electronic device of claim 3, wherein one or both of the top heat spreader and the bottom heat spreader defines an area that is larger than an area defined by the printed circuit board.

8. The electronic device of claim 3, wherein resulting heat paths for the heat-generating component include a heat path through the top surface to the top heat spreader, a heat path through the bottom surface to the bottom heat spreader, and heat paths through at least a portion of the multiple side surfaces through the printed circuit board through the at least one heat-directing pad to the top heat spreader and the bottom heat spreader.

9. The electronic device of claim 1, wherein the printed circuit board comprises a plurality of layers and a plurality of heat-directing vias thermally coupling two or more of the plurality of layers.

10. The electronic device of claim 1, wherein the heat-directing pad is characterized by a U-shape extending about the heat-generating component.

11. The electronic device of claim 1, wherein EMI shielding is positioned in contact with the printed circuit board laterally outward from and extending about the heat-directing pad.

12. The electronic device of claim 11, wherein the EMI shielding includes a gasket extending orthogonally to a vertical wall in contact with the printed circuit board.

13. The electronic device of claim 1, wherein the heat-directing pad extends about and adjacent to all but one lateral side of the heat-generating component.

14. An electronic device, comprising: a printed circuit board having a plurality of electronic elements including a heat generating component having a top surface, a bottom surface, and multiple side surfaces; and a heat sink structure configured to dissipate heat from the heat-generating component, the heat sink structure including one or more heat spreaders, a heat-directing component, and a portion of the printed circuit board between the heat-generating component and the heat-directing component, wherein the heat-directing component extends normal to the printed circuit board, and wherein the heat-directing component extends laterally about all but one side surface[s] of the heat-generating component, and is adjacent each of the side surfaces without intervening components.

15. The electronic device of claim 14, wherein the heat-directing component comprises a metal pad that is integrally formed on the printed circuit board.

16. The electronic device of claim 14, wherein the heat-generating component comprises four sides, and the heat-directing component surrounds the heat-generating component on three of the four sides.

17. The electronic device of claim 14, wherein the heat sink structure further includes:
- a top heat spreader located above and in thermal contact with the heat-generating component top surface, and
- a bottom heat spreader located below and in thermal contact with the heat-generating component bottom surface, the bottom heat spreader being adapted to provide EMI shielding for at least some of the electronic elements.

18. The electronic device of claim 17, wherein the heat-directing component directs heat received from the heat-generating component via the printed circuit board into the top heat spreader and the bottom heat spreader.

19. The electronic device of claim 17, wherein the top beat spreader and bottom heat spreader substantially surround the printed circuit board.

20. The electronic device of claim 14, wherein resulting heat paths for the heat-generating component include a beat path through its top surface, a heat path through its bottom surface, and heat paths through at least a portion of the multiple side surfaces through the printed circuit board and to the heat-directing component.

* * * * *

UNITED STATES PATENT AND TRADEMARK OFFICE
CERTIFICATE OF CORRECTION

PATENT NO. : 10,061,363 B2
APPLICATION NO. : 14/846526
DATED : August 28, 2018
INVENTOR(S) : Jonathan A. Matheson et al.

Page 1 of 1

It is certified that error appears in the above-identified patent and that said Letters Patent is hereby corrected as shown below:

In the Claims

In Column 11, Line 27, Claim 5: please delete "forth" and insert --form--.

In Column 12, Line 19, Claim 14: please delete "surface[s]" and insert --surface--.

In Column 12, Line 45, Claim 19: please delete "beat" and insert --heat--.

In Column 12, Line 49, Claim 20: please delete "beat" and insert --heat--.

Signed and Sealed this
Ninth Day of October, 2018

Andrei Iancu
*Director of the United States Patent and Trademark Office*